(12) United States Patent
Sakaue et al.

(10) Patent No.: US 11,301,104 B2
(45) Date of Patent: Apr. 12, 2022

(54) WIRING STRUCTURE MANUFACTURING METHOD AND WIRING STRUCTURE

(71) Applicant: JAPAN AVIATION ELECTRONICS INDUSTRY, LIMITED, Tokyo (JP)

(72) Inventors: Akitoshi Sakaue, Tokyo (JP); Yutaka Takezawa, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 17/239,755

(22) Filed: Apr. 26, 2021

(65) Prior Publication Data

US 2021/0240306 A1 Aug. 5, 2021

Related U.S. Application Data

(63) Continuation of application No. 16/689,420, filed on Nov. 20, 2019, now Pat. No. 11,093,095.

(30) Foreign Application Priority Data

Dec. 26, 2018 (JP) .............................. JP2018-241999

(51) Int. Cl.
*G06F 3/044* (2006.01)
*H05K 3/12* (2006.01)

(52) U.S. Cl.
CPC .......... *G06F 3/0446* (2019.05); *H05K 3/1275* (2013.01); *G06F 2203/04103* (2013.01);
(Continued)

(58) Field of Classification Search
CPC ......... G06F 3/0446; G06F 2203/04103; G06F 2203/04112; H05K 3/1275; H05K 2203/0534
(Continued)

(56) References Cited

U.S. PATENT DOCUMENTS 9,252,770 B2   2/2016   Okumura et al.
9,830,038 B2   11/2017  Kim et al.
(Continued)

FOREIGN PATENT DOCUMENTS

CN   102043535 B   3/2016
CN   104205030 B   3/2016
(Continued)

OTHER PUBLICATIONS

Office Action issued in Republic of Korea Counterpart Patent Appl. No. 10-2019-0152400, dated Jan. 19, 2021, along with an English translation thereof.
(Continued)

*Primary Examiner* — Mark Edwards
(74) *Attorney, Agent, or Firm* — Greenblum & Bernstein, P.L.C.

(57) ABSTRACT

A wiring structure that includes first wiring parts which are formed of conductive wires and second wiring parts which are formed of thicker conductive wires than the conductive wires of the first wiring parts and are connected to the first wiring parts is formed by offset printing which includes the following processes. First printing process: First conductive ink for forming the first wiring parts is transferred from a first blanket to a base. Second printing process: Second conductive ink for forming the second wiring parts is transferred from a second blanket, which is different from the first blanket, to the base.

6 Claims, 11 Drawing Sheets

(52) U.S. Cl.
CPC .............. *G06F 2203/04112* (2013.01); *H05K 2203/0534* (2013.01)

(58) Field of Classification Search
USPC ......................................................... 345/174
See application file for complete search history.

(56) References Cited

U.S. PATENT DOCUMENTS

| | | | |
|---|---|---|---|
| 10,064,293 B2 | 8/2018 | Kogawa et al. | |
| 2011/0096005 A1* | 4/2011 | Kim .................... | G06F 3/0446 345/173 |
| 2011/0279401 A1* | 11/2011 | Hong ................... | G06F 3/0446 345/174 |
| 2015/0041302 A1* | 2/2015 | Okumura .............. | G06F 3/0443 200/600 |
| 2015/0177867 A1* | 6/2015 | Chung .................. | G06F 3/0446 345/174 |
| 2019/0073050 A1 | 3/2019 | Sakaue et al. | |
| 2020/0183537 A1 | 6/2020 | Sakaue et al. | |

FOREIGN PATENT DOCUMENTS

| | | |
|---|---|---|
| JP | 2017-061107 A | 3/2017 |
| JP | 2017-103317 A | 6/2017 |

OTHER PUBLICATIONS

Office Action issued in Republic of Korea Counterpart Patent Appl. No. 10-2019-0152400, dated Mar. 29, 2021, along with an English translation thereof.

Office Action issued in Republic of Korea Counterpart Patent Appl. No. 10-2019-0152400, dated May 18, 2021, along with an English translation thereof.

Taiwanese Office Action in corresponding Taiwanese Application No. 108143115, dated Jul. 31, 2020, and English translation thereof.

* cited by examiner

WIRING STRUCTURE MANUFACTURING METHOD AND WIRING STRUCTURE

CROSS-REFERENCE TO RELATED APPLICATIONS

The present application is a continuation application of U.S. patent application Ser. No. 16/689,420 filed Nov. 20, 2019, which claims the benefit of Japanese Patent Application No. 2018-241999 filed Dec. 26, 2018. The disclosure of each of the above-noted applications is expressly incorporated herein by reference in its entirety.

TECHNICAL FIELD

The present invention relates to a wiring structure manufacturing method and a wiring structure and more specifically, relates to a wiring structure manufacturing method and a wiring structure realized by using a printing technique.

BACKGROUND ART

Related Art

Wiring structures for electronic devices such as a touch panel and a liquid crystal display are formed by using a printing technique for favorable productivity. Gravure offset printing is suitable for forming a wiring structure having a fine pattern.

FIGS. 1, 2A, 2B, and 2C illustrate a configuration of an electrostatic capacitance type touch panel which is manufactured by using gravure offset printing (Patent Literature 1: Japanese Patent Application Laid Open No. 2017-103317).

Figure 1:
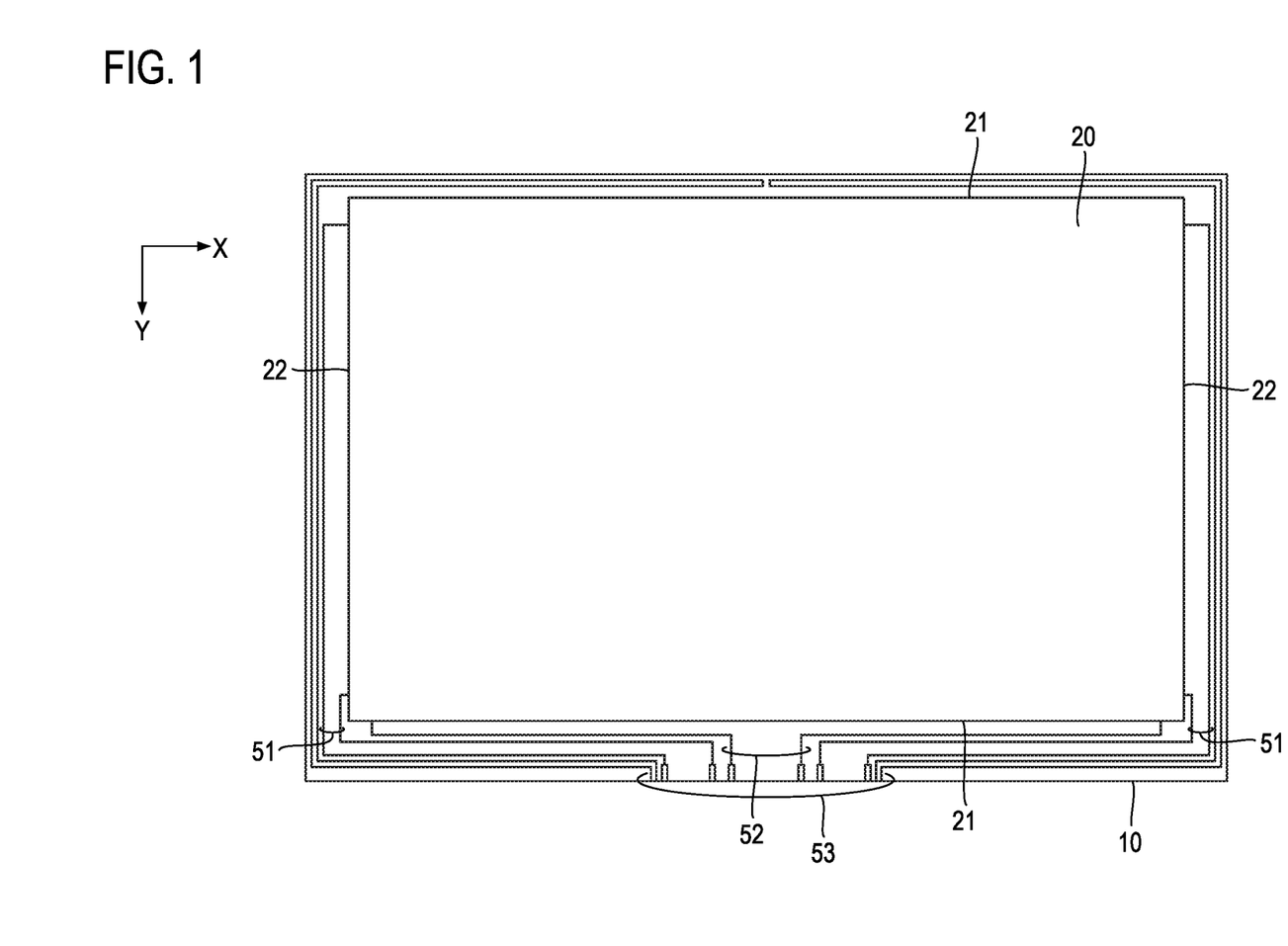
FIG. 1 illustrates a configuration example of a touch panel of related art.

A touch panel has a structure in which a first conductor layer, an insulation layer, a second conductor layer, and a protection film are layered in this order on a transparent base 10. FIG. 1 omits detailed illustration of sensor electrodes.

Figure 2A:
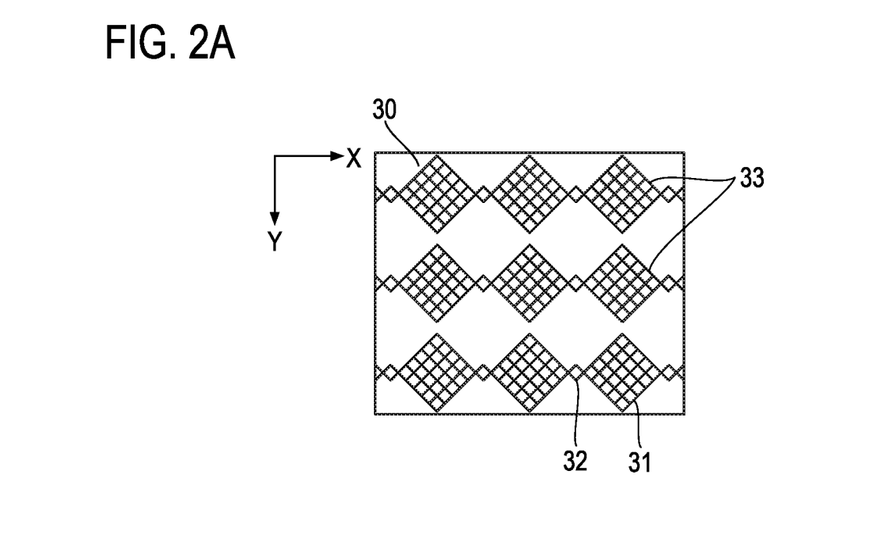
FIG. 2A is an enlarged view illustrating details of a first sensor electrode of the touch panel illustrated in FIG. 1.
Figure 2B:
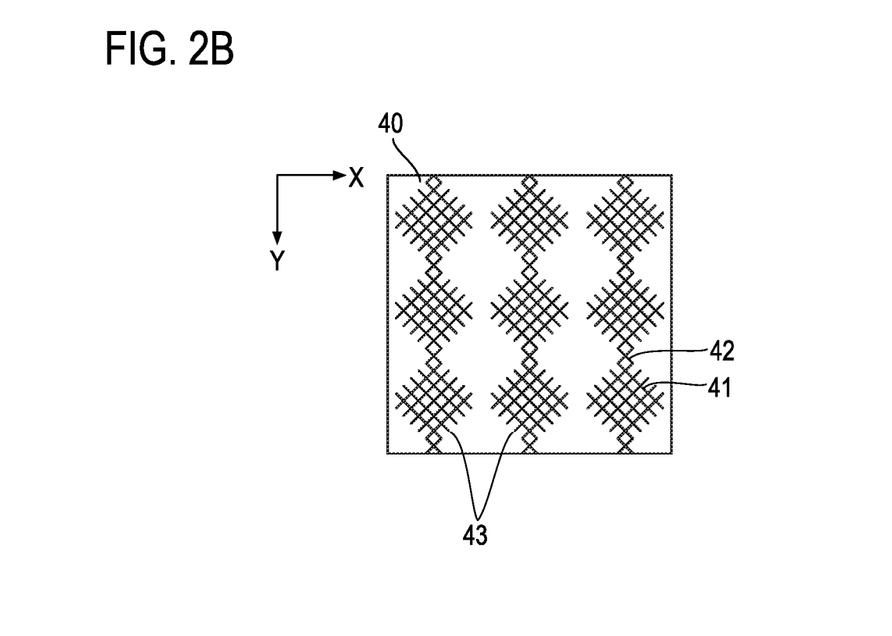
FIG. 2B is an enlarged view illustrating details of a second sensor electrode of the touch panel illustrated in FIG. 1.

The sensor electrodes include a first sensor electrode and a second sensor electrode. The first sensor electrode is formed on the first conductor layer and the second sensor electrode is formed on the second conductor layer. The first sensor electrode is insulated from the second sensor electrode by the insulation layer.

The first sensor electrode 30 includes electrode arrays 33 which are arrayed in the Y direction parallel to a short side 22 of a sensor region 20, the electrode arrays 33 being arrayed in parallel with each other. Each of the electrode arrays 33 includes island shaped electrodes 31 which are arrayed in the X direction parallel to a long side 21 of the sensor region 20, and coupling parts 32 each coupling two adjacent island shaped electrodes 31.

The second sensor electrode 40 includes electrode arrays 43 which are arrayed in the X direction, the electrode arrays 43 being arrayed in parallel with each other. Each of the electrode arrays 43 includes island shaped electrodes 41 which are arrayed in the Y direction, and coupling parts 42 each coupling two adjacent island shaped electrodes 41.

Each of the first sensor electrode 30 and the second sensor electrode 40 has a mesh structure formed of thin conductive wires. When the touch panel is viewed from the front, the electrode arrays 33 of the first sensor electrode 30 and the electrode arrays 43 of the second sensor electrode 40 mutually intersect in a state in which the island shaped electrodes 31 and the island shaped electrodes 41 do not overlap with each other and the coupling parts 32 and the coupling parts 42 mutually intersect.

Each end, situated in the X direction, of each of the electrode array 33 is connected to one end of a corresponding one of frame wires 51. One end, situated in the Y direction, of each of the electrode array 43 is connected to one end of a corresponding one of frame wires 52. The frame wires 51 and 52 are formed in the outside of the sensor region 20. FIG. 1 illustrates only frame wires 51 and 52 which are positioned on both ends, among all the frame wires 51 and 52.

Terminals 53 are formed in a central part of one long side of the base 10 having a rectangular shape. The other ends of the frame wires 51 and 52 are connected to the terminals 53. The frame wires 51 and 52 and the terminals 53 are formed on the first conductor layer.

Figure 2C:
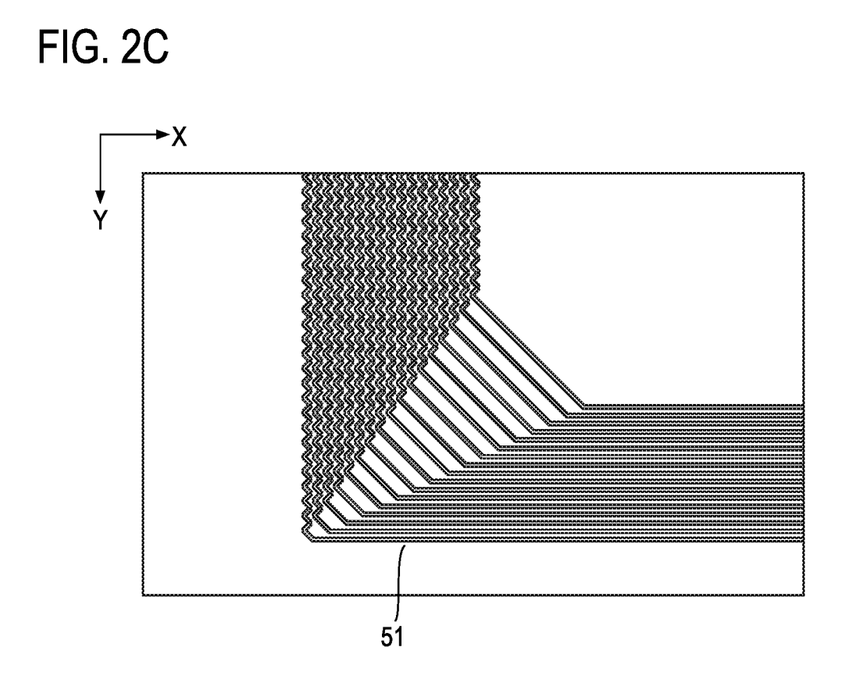
FIG. 2C is an enlarged view illustrating details of frame wires of the touch panel illustrated in FIG. 1.

FIG. 2C illustrates details of the frame wires 51 on a lower left corner part of the touch panel illustrated in FIG. 1. Each of the frame wires 51 and 52 has a single wire structure which is formed of a thick conductive wire.

Figure 3A:
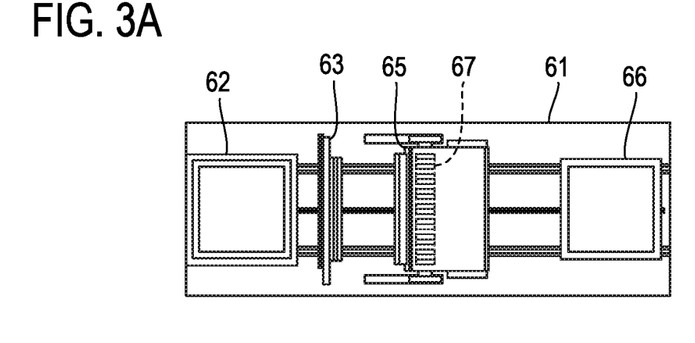
FIG. 3A is a plan view illustrating an offset printing device of related art.
Figure 3B:
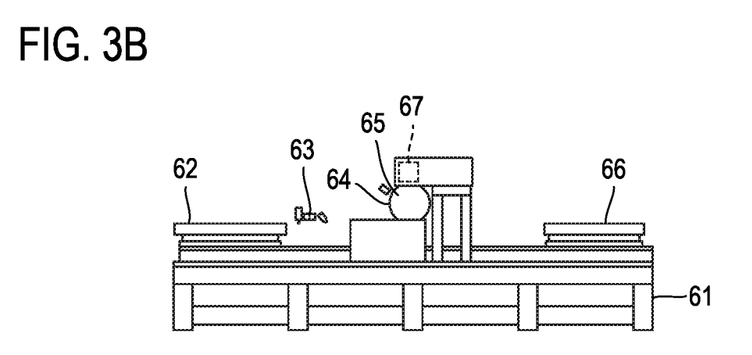
FIG. 3B is a front elevational view illustrating the offset printing device of related art.

FIGS. 3A and 3B illustrate an offset printing device disclosed in Patent Literature 2 (Japanese Patent Application Laid Open No. 2017-61107). Patent Literature 2 discloses the offset printing device that is capable of stabilizing printing quality during repeated printing, in a process for forming a wiring structure of an electronic device by gravure offset printing.

The offset printing device includes a base unit 61, a plate stage unit 62 on which a plate for printing is placed, an ink supply unit 63 which supplies ink paste to a plate, a blanket 64 which receives the ink paste on the plate stage unit 62, a roller unit 65 around which the blanket 64 is wound, a work stage unit 66 on which a printing object, on which the ink paste received by the blanket 64 is to be transferred, is placed, and a split type drying unit 67. The split type drying unit 67 is disposed above the roller unit 65. The split type drying unit 67 faces a surface of the blanket 64. The split type drying unit 67 includes LED light sources for drying solvent of ink absorbed by the blanket 64. The LED light sources are aligned in the axis direction of the roller unit 65. A light irradiation dose of each of the LED light sources is independently changed.

The offset printing device controls density of solvent in the blanket during repeated printing depending on pattern density of a printing pattern so as to stabilize printing quality during repeated printing. This is because density of solvent which is to remain in a blanket varies depending on pattern density of a printing pattern.

Figure 4:
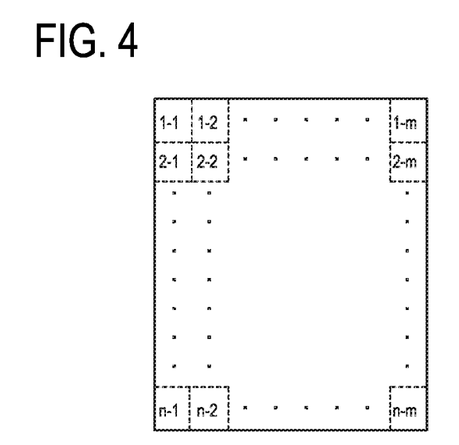
FIG. 4 illustrates a dividing example of a printing pattern.

Specifically, a printing pattern is divided into n×m pieces of regions [i,j] ($i \in \{1, 2, \ldots, n\}$, $j \in \{1, 2, \ldots, m\}$) as illustrated in FIG. 4, pattern density is obtained for each region, and a light irradiation dose optimum for the pattern density is determined. An LED light source irradiates the region [i,j] on the blanket 64 with light at an irradiation dose optimum for this region [i,j]. As a result, solvent is vaporized at an amount corresponding to the pattern density from the region [i,j] of the blanket 64. Thus, printing quality during repeated printing can be stabilized for any pattern density.

<Analysis of Related Art>

In order to realize favorable gravure offset printing, it is important that a swelling amount, or content of absorbed solvent, of a blanket which swells by absorbing solvent in ink is within an appropriate range. The offset printing device disclosed in Patent Literature 2 controls the swelling amount for each region by using a split type drying unit.

In a touch panel whose conductor layer is formed by gravure offset printing, ink density, or ink amount per unit area, of the first sensor electrode 30, which has the mesh structure formed of thin conductive wires, is different from ink density of the frame wires 51 and 52, which have the single wire structure formed of a thick conductive wire. Therefore, a swelling state in a region corresponding to the mesh structure is largely different from a swelling state in a region corresponding to the single wire structure.

Figure 5:
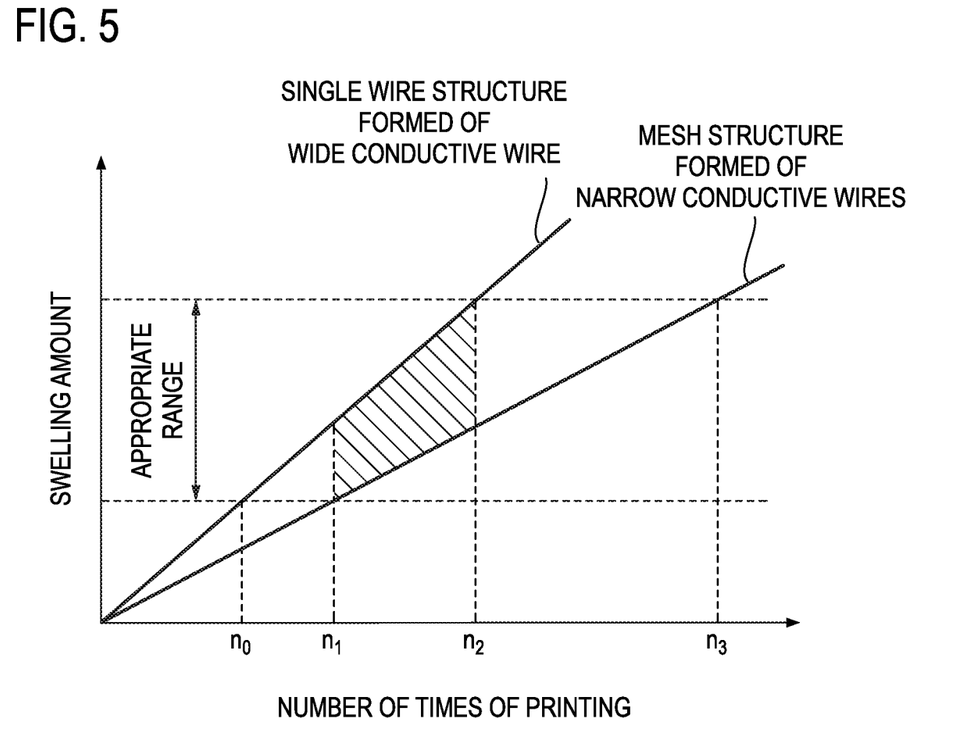
FIG. 5 is a graph showing a relation between the number of times of printing and a swelling amount of a blanket obtained when thin conductive wires and thick conductive wires are repeatedly printed by gravure offset printing.

FIG. 5 illustrates a relation between the number of times of printing and a swelling amount of a blanket obtained when gravure offset printing is performed by using an unused blanket to form a printing pattern for a mesh structure formed of thin conductive wires and a relation between the number of times of printing and a swelling amount of a blanket obtained when gravure offset printing is performed by using an unused blanket to form a printing pattern for a single wire structure formed of a thick conductive wire. From FIG. 5, it is understood that a swelling rate, which is calculated by dividing swelling amount by number of times of printing, in forming the printing pattern for a single wire structure formed of a thick conductive wire is remarkably larger than a swelling rate in forming the printing pattern for a mesh structure formed of thin conductive wires.

Accordingly, in simultaneous printing of two kinds of wiring patterns having mutually-different swelling rates by using one blanket, favorable gravure offset printing can be performed only when the swelling amounts of the two are within an appropriate range. That is, the number of times of printing by which favorable gravure offset printing can be performed is only the number of times N ($N=n_2-n_1$) corresponding to a range illustrated in FIG. 5 by hatching.

The above-mentioned technique disclosed in Patent Literature 2, for example, is useful to enhance utilization efficiency of a blanket by increasing the number of times of printing. However, a device such as a split type drying unit is required and a troublesome operation for obtaining pattern density is also required. In a method for calculating pattern density disclosed in Patent Literature 2, specifically, in a method in which pattern density D is calculated by $D=S2/S1$, where an area of one region is S1 and a total area of a printing pattern in the region is S2, pattern density obtained when a printing pattern for a wiring structure formed of thin conductive wires exists on the whole surface of the region is substantially the same as pattern density obtained when a printing pattern for a wiring structure formed of thick conductive wires exists in a part of the region. Thus, the problem in which a swelling amount cannot be properly controlled arises in a simple calculation method.

SUMMARY OF THE INVENTION

An object of the present invention is to provide a printing technique realizing high utilization efficiency of a blanket.

The technical matters to be mentioned in this section are intended not to explicitly or implicitly limit the claimed invention or state possibility for accepting such a limit made by a person other than those who are to be benefitted from the present invention (for example, the applicant and the entitled person), but to merely facilitate understanding of the gist of the present invention.

A pattern for a wiring structure formed of thin conductive wires and a pattern for a wiring structure formed of a thicker conductive wire than the thin conductive wires are printed through different printing processes. A blanket used for printing a pattern for a wiring structure formed of thin conductive wires is different from a blanket used for printing a pattern for a wiring structure formed of a thick conductive wire.

According to the present invention, different blankets are used for patterns having different swelling rates, realizing high utilization efficiency of blankets.

DETAILED DESCRIPTION OF THE EMBODIMENTS

The gist of an embodiment is now provided. In a process for forming, by offset printing, a wiring structure that includes a first wiring part which is formed of thin conductive wires and a second wiring part which is formed of thicker conductive wires than the conductive wires of the first wiring part and is connected to the first wiring part, a pattern for the first wiring part and a pattern for the second wiring part are separately printed on the same base, in which a blanket used for printing the pattern for the first wiring part is different from a blanket used for printing the pattern for the second wiring part. The base on which a wiring structure is formed is sometimes referred to as a printed wiring board. An embodiment is specifically described below with reference to the accompanying drawings by employing a touch panel as an example of an electronic device having a wiring structure.

The touch panel includes a first sensor electrode and a second sensor electrode which have a mesh structure formed of thin conductive wires, frame wires each of which is connected to the first sensor electrode or the second sensor electrode, and terminals which are connected to the frame wires. The frame wire is a thick conductive wire and the terminal has a mesh structure formed of thin conductive wires.

The first sensor electrode, the second sensor electrode, the frame wires, and the terminals are formed by gravure offset printing using conductive ink containing conductive particles of silver or the like. In the embodiment, these wiring parts are formed through three times of printing process. FIGS. 6, 7A, 7B, 7C, 8A, 8B, and 8C illustrate a pattern of the wiring part to be formed in each printing process.

Figure 6:
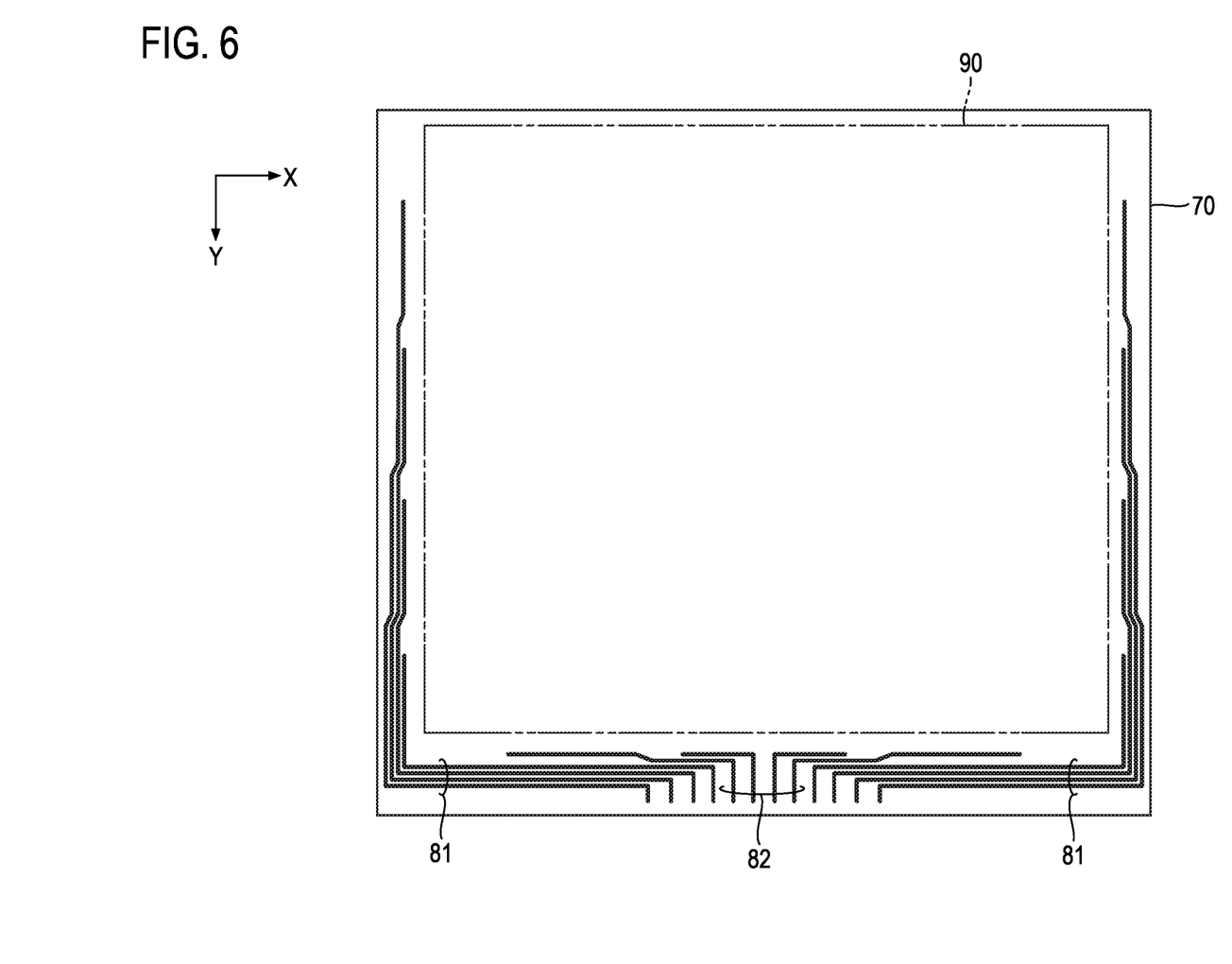
FIG. 6 is a diagram for explaining a method for manufacturing a wiring structure according to an embodiment.

FIG. 6 illustrates patterns of frame wires 81 and 82 which are formed on a base 70 in the first gravure offset printing. Each of predetermined frame wires 81 and 82 is formed as a thick conductive wire in a frame region surrounding a sensor region 90. The line width of each of the frame wires 81 and 82 is 40 μm in the embodiment.

Figure 7A:
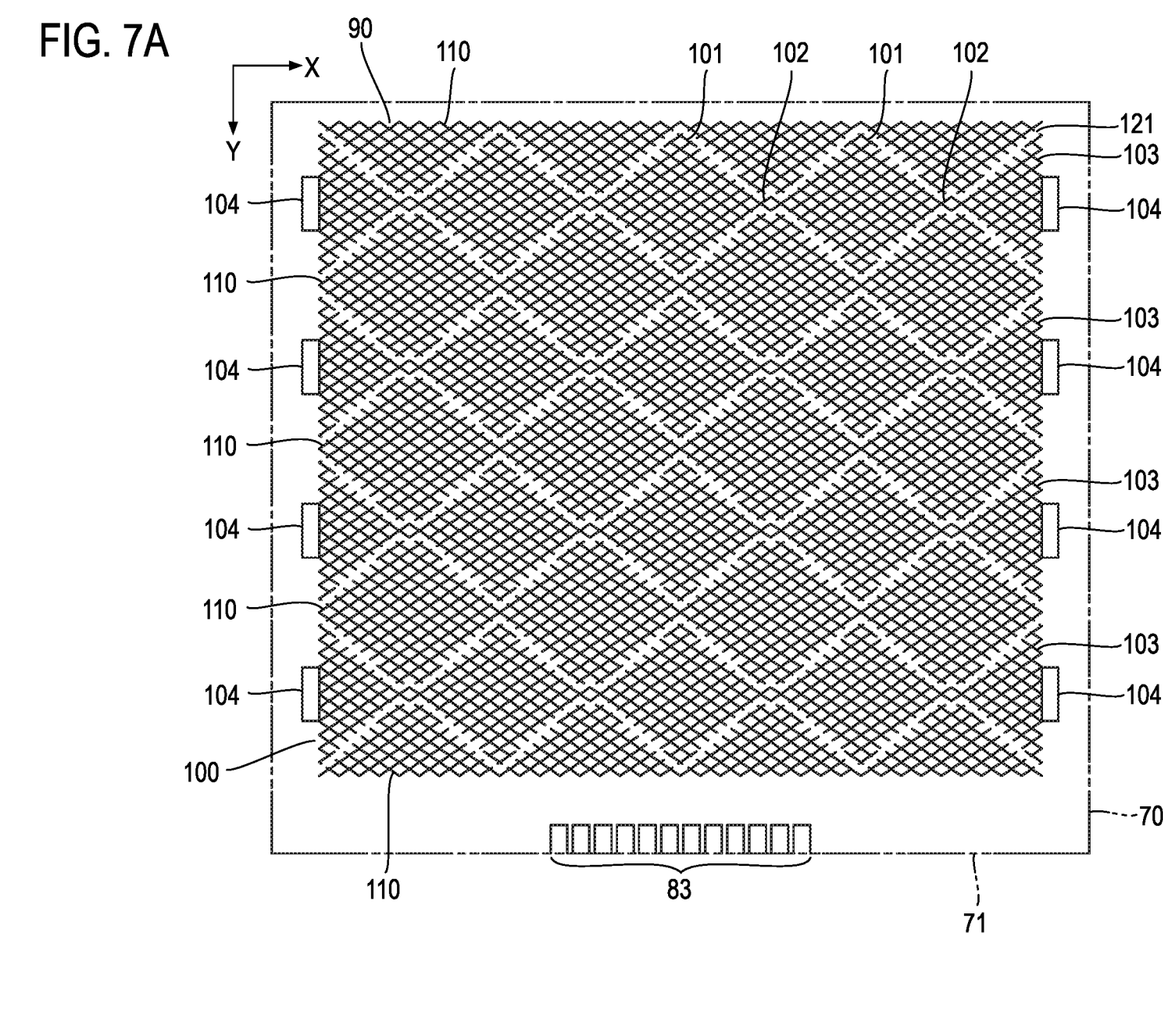
FIG. 7A is a diagram for explaining a first process of the embodiment.
Figure 7B:
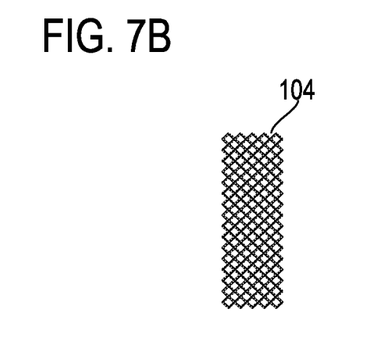
FIG. 7B is an enlarged view illustrating details of a connecting part in FIG. 7A.
Figure 7C:
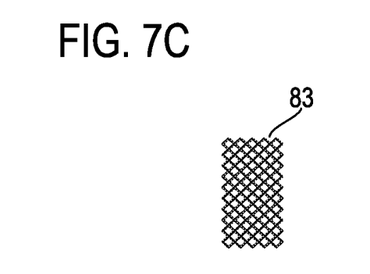
FIG. 7C is an enlarged view illustrating details of a terminal in FIG. 7A.

FIGS. 7A, 7B, and 7C illustrate a pattern of a wiring part to be formed on the base 70, on which the frame wires 81 and 82 have been formed, in the second gravure offset printing. In this printing process, a first sensor electrode 100 and a first dummy wiring part 110 are formed in the sensor region 90. The first sensor electrode 100 includes electrode arrays 103 which are arrayed in the Y direction, the electrode arrays 103 being arrayed in parallel with each other. Each of the electrode arrays 103 includes island shaped electrodes 101 which are arrayed in the X direction and coupling parts 102 each of which couples adjacent island shaped electrodes 101. The first dummy wiring part 110 is formed on regions other than the region on which the first sensor electrode 100 is printed, in the sensor region 90. A gap 121 is provided between the first sensor electrode 100 and the first dummy wiring part 110, and the first sensor electrode 100 and the first dummy wiring part 110 are mutually insulated.

The first sensor electrode 100 and the first dummy wiring part 110 have the mutually same mesh structure. The mesh structure has rhombic apertures in the same size. In the embodiment, the length of one side of the rhombic aperture is 400 μm and the line width of each of the thin conductive wires constituting the mesh structure is 7 μm.

Connecting parts 104 are each connected to both ends, situated in the X direction, of each electrode array 103. FIG. 7B illustrates details of the connecting part 104. The connecting part 104 has a mesh structure formed of thin conductive wires. In the embodiment, an aperture of the connecting part 104 is a square whose side is 20 μm and the line width of each of the thin conductive wires constituting the mesh structure is 7 μm.

Terminals 83 are aligned along the central portion of one long side 71 of the base 70. FIG. 7C illustrates details of the terminal 83. The terminal 83 has a mesh structure formed of thin conductive wires. The mesh structure of the terminal 83 is the same as the mesh structure of the connecting part 104.

Figure 8A:
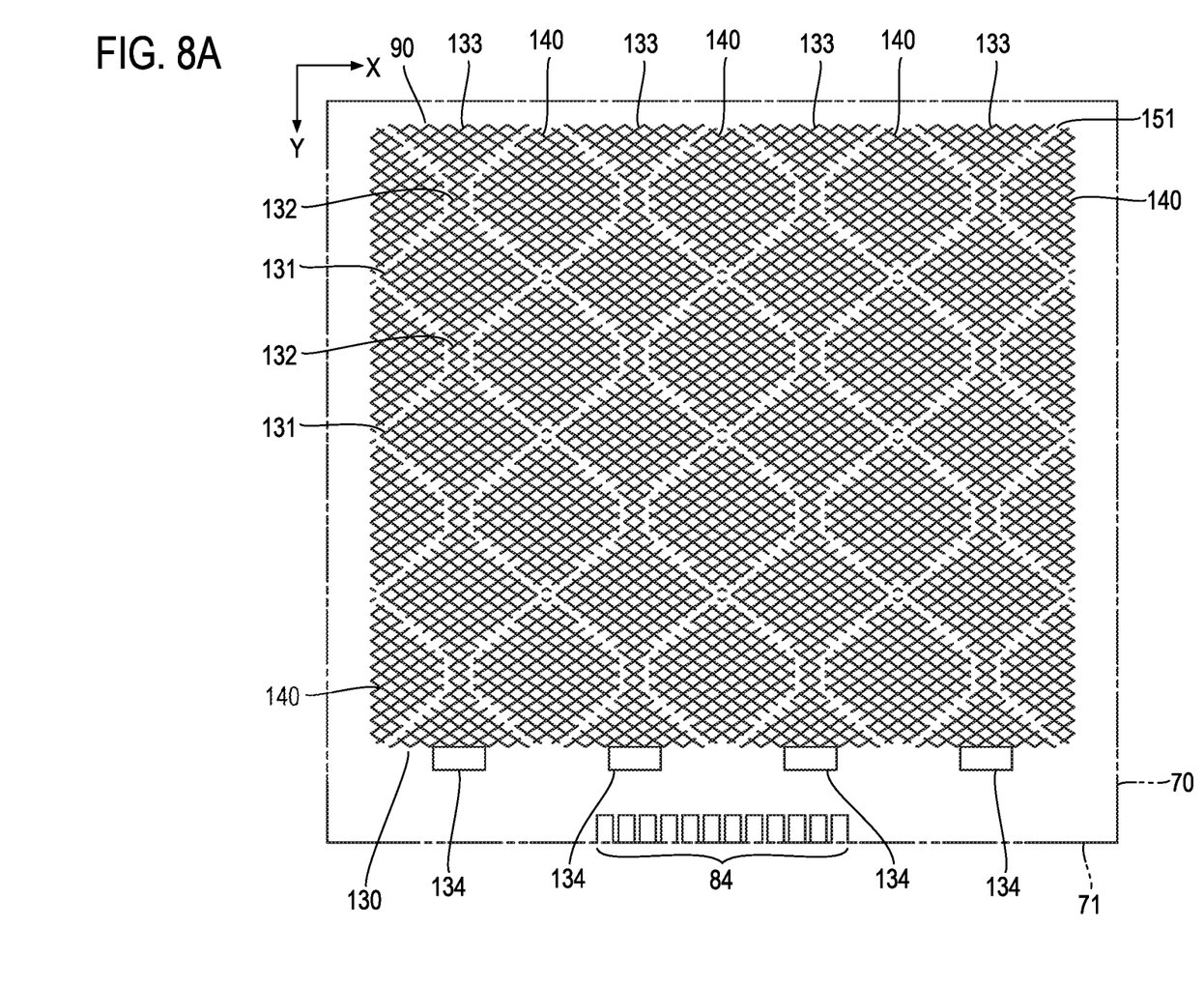
FIG. 8A is a diagram for explaining a second process of the embodiment.
Figure 8B:
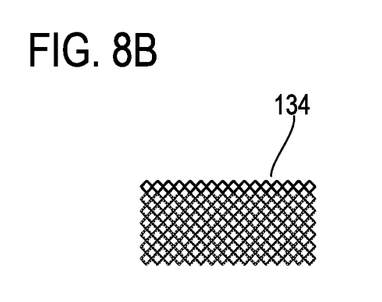
FIG. 8B is an enlarged view illustrating details of a connecting part in FIG. 8A.
Figure 8C:
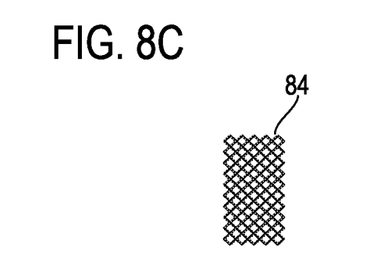
FIG. 8C is an enlarged view illustrating details of a terminal in FIG. 8A.

FIGS. 8A, 8B, and 8C illustrate a pattern of a wiring part to be formed on the wiring part, which is illustrated in FIG. 7A, in the third gravure offset printing. An insulation layer is formed after the wiring part illustrated in FIG. 7A is formed, and the third gravure offset printing is subsequently performed. In this printing process, a second sensor electrode 130 and a second dummy wiring part 140 are formed in the sensor region 90. The second sensor electrode 130 includes electrode arrays 133 which are arrayed in the X direction, the electrode arrays 133 being arrayed in parallel with each other. Each of the electrode arrays 133 includes island shaped electrodes 131 which are arrayed in the Y direction and coupling parts 132 each of which couples adjacent island shaped electrodes 131. The second dummy wiring part 140 is formed on regions other than the region on which the second sensor electrode 130 is printed, in the sensor region 90. A gap 151 is provided between the second sensor electrode 130 and the second dummy wiring part 140, and the second sensor electrode 130 and the second dummy wiring part 140 are mutually insulated.

The second sensor electrode 130 and the second dummy wiring part 140 have the mutually same mesh structure. The mesh structure has rhombic apertures in the same size. In the embodiment, this mesh structure is the same as the mesh structure of the first sensor electrode 100 and the first dummy wiring part 110.

One side of the rhombic aperture in the mesh structure of the first sensor electrode 100 and the first dummy wiring part 110 intersects with one side of the rhombic aperture in the mesh structure of the second sensor electrode 130 and the second dummy wiring part 140 at the middle points of the sides. Accordingly, rhombic apertures are formed to have 200 μm of side length when the sensor region 90 is viewed from the front. When the sensor region 90 is viewed from the front, the electrode arrays 103 of the first sensor electrode 100 and the electrode arrays 133 of the second sensor electrode 130 mutually intersect in a state in which the island shaped electrodes 101 and the island shaped electrodes 131 do not overlap with each other and the coupling parts 102 and the coupling parts 132 mutually intersect.

A connecting part 134 is connected to one end, in the Y direction, of each of the electrode arrays 133. FIG. 8B illustrates details of the connecting part 134. The connecting part 134 has a mesh structure formed of thin conductive wires. The mesh structure of the connecting part 134 is the same as the mesh structure of the connecting part 104.

Terminals 84 are also formed in the third gravure offset printing. FIG. 8C illustrates details of the terminal 84. An insulation layer is not formed on the region in which the terminals 83 are formed, so that the terminals 84 are directly disposed on the terminals 83. The mesh structure of the terminal 84 is the same as the mesh structure of the terminal 83. One side of a square aperture of the terminal 83 and one side of a square aperture of the terminal 84 mutually intersect at the middle points of the sides. Accordingly, square apertures are formed to have 10 μm side length when the region in which the terminal 83 and 84 are formed is viewed from the front.

In the above-described three times of gravure offset printing process, mutually-different blankets are each used.

Figure 9A:
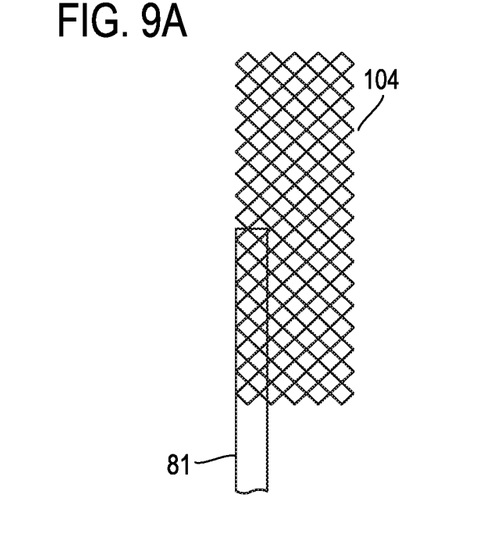
FIG. 9A is an enlarged view illustrating a state in which the connecting part of FIG. 7B is mounted on a frame wire of FIG. 6.
Figure 9B:
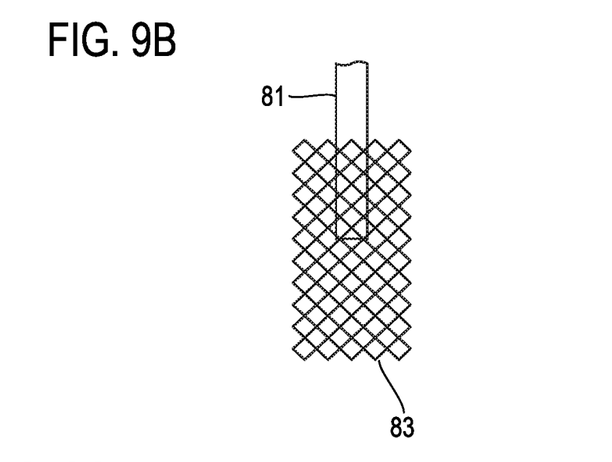
FIG. 9B is an enlarged view illustrating a state in which the terminal of FIG. 7C is mounted on the frame wire of FIG. 6.
Figure 9C:
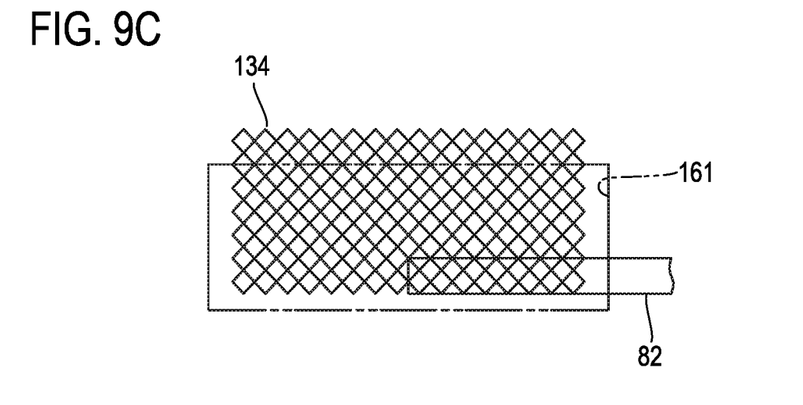
FIG. 9C is an enlarged view illustrating a state in which the connecting part of FIG. 8B is mounted on the frame wire of FIG. 6.

FIGS. 9A, 9B, and 9C illustrate portions on which wiring parts formed through different gravure offset printing processes are conducted with each other. FIG. 9A illustrates a state in which the connecting part 104 is formed on one end of the frame wire 81. FIG. 9B illustrates a state in which the terminal 83 is formed on the other end of the frame wire 81. FIG. 9C illustrates a state in which the connecting part 134 is formed on one end of the frame wire 82 which is exposed from a hole 161 of an insulation layer. The hole 161 is formed on a portion, which corresponds to one end of the frame wire 82, of the insulation layer.

Figure 10:
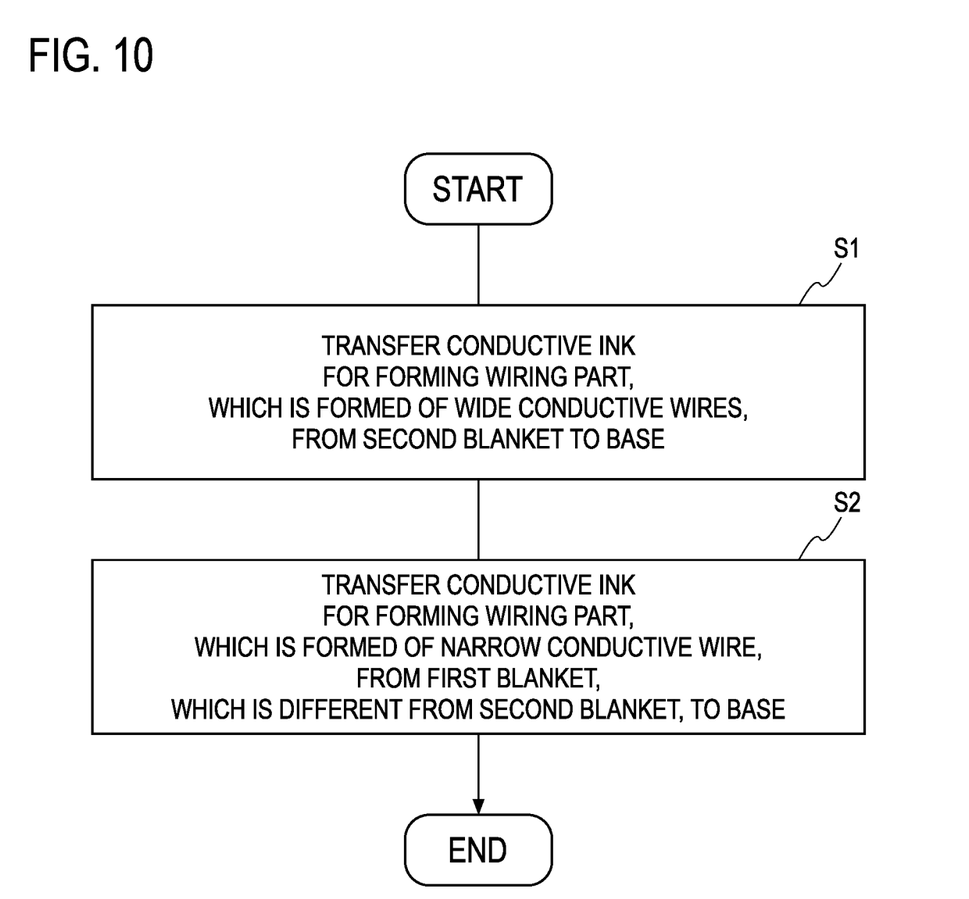
FIG. 10 is a flow diagram of the manufacturing method according to the embodiment.

Thus, the manufacturing method according to the embodiment includes: a printing process (S1) for transferring conductive ink for forming a wiring part such as a frame wire having a single wire structure, which is formed of a thick conductive wire, from a second blanket to a base; and a printing process (S2) for transferring conductive ink for forming a wiring part such as a sensor electrode having a mesh structure, which is formed of thin conductive wires, from a first blanket, which is different from the second blanket, to the base.

Printing of thin conductive wires and printing of thick conductive wires are separately performed and different blankets are each used, providing the following advantageous effects.

(1) An uneven swelling state is not generated in a blanket, so that it is unnecessary to take the trouble of controlling a swelling amount of a blanket for each region by using a split type drying unit (see Patent Literature 2). Further, the number of times of printing per blanket is increased, increasing utilization efficiency of the blanket. Referring to FIG. 5, the number of times of printing N1 in which favorable printing can be performed with a blanket used for printing thick conductive wires is $N1=n_2-n_0$ and the number of times of printing N2 in which favorable printing can be performed with a blanket used for printing thin conductive wires is $N2=n_3-n_1$. Thus, the number of times of printing is remarkably increased compared to the number of times of printing $N=n_2-n_1$ for the case where thin conductive wires and thick conductive wires are together printed.

Further, the number of times of blanket exchange which requires much man-hour can be reduced and the print cycle time can be thus shortened.

(2) The process for printing thin conductive wires and the process for printing thick conductive wires are separate processes, so that mutually-different conductive ink can be used. For example, a solvent amount of conductive ink to be used can be optimized in each printing process. Hardness of a blanket and so on can be also optimized in each printing process.

In the embodiment, the printing process for frame wires is first performed and the printing process for wiring parts in a sensor region is subsequently performed, preventing the wiring parts having a fine pattern in the sensor region from being damaged in the printing process for the frame wires.

The order for forming respective wiring parts in a touch panel may be an order: the wiring part in FIG. 7→the insulation layer→the wiring part in FIG. 6→the wring part in FIG. 8, for example.

The foregoing description of the embodiment of the invention has been presented for the purpose of illustration and description. It is not intended to be exhaustive and to limit the invention to the precise form disclosed. Modifications or variations are possible in light of the above teaching. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for producing a wiring structure of a touch panel having defined a sensor region therein, the method comprising:
    transferring first conductive ink from a first blanket to the base to form a first wiring part formed of a conductive wire on the base, the first wiring part including a wiring part located in the sensor region and another wiring part located outside of the sensor region, wherein the first blanket offsets onto the base only the first conductive ink which forms the first wiring part; and
    transferring second conductive ink from a second blanket to the base to form a second wiring part on the base, the second blanket being different from the first blanket, the second wiring part located outside of the sensor region, wherein the second wiring part is formed of a wider conductive wire than the conductive wire of the first wiring part, and wherein the second blanket offsets onto the base only the second conductive ink which forms the second wiring part.

2. The method according to claim 1, wherein
    the transferring of the first conductive ink is performed after the transferring of the second conductive ink.

3. The method according to claim 1, wherein
    the first wiring part is formed in a region other than a region in which the second wiring part is formed on the base, except for a portion thereof which is in direct contact with the second wiring part.

4. A method for mass-producing a wiring structure of a touch panel having defined a sensor region therein by offset-printing conductive ink on a base, the method comprising repetition of a combination of:
    transferring first conductive ink from a first blanket to the base to form a first wiring part formed of a conductive wire on the base, the first wiring part including a wiring part located in the sensor region and another wiring part located outside of the sensor region; and
    transferring second conductive ink from a second blanket to the base to form a second wiring part on the base, the second blanket being different from the first blanket, the second wiring part located outside of the sensor region, wherein the second wiring part is formed of a wider conductive wire than the conductive wire of the first wiring part,
    wherein the first blanket is used to transfer only the first conductive ink to the base to form the first wiring part and the second blanket is used to transfer only the second conductive ink to the base to form the second wiring part through the repetition of the combination.

5. The method according to claim 4, wherein
    in the combination, the transferring of the first conductive ink is performed after the transferring of the second conductive ink.

6. The method according to claim 4, wherein
    the first wiring part is formed in a region other than a region in which the second wiring part is formed on the base, except for a portion thereof which is in direct contact with the second wiring part.

* * * * *